United States Patent [19]

Kanno et al.

[11] Patent Number: 5,969,537
[45] Date of Patent: Oct. 19, 1999

[54] SEMICONDUCTOR DEVICE TESTING APPARATUS

[75] Inventors: Yukio Kanno, Ohra-gun; Toshio Goto, Kumagaya, both of Japan

[73] Assignee: Advantest Corporation, Tokyo, Japan

[21] Appl. No.: 09/021,369

[22] Filed: Feb. 10, 1998

[30] Foreign Application Priority Data

Feb. 13, 1997  [JP]  Japan .................................. 9-028843

[51] Int. Cl.⁶ .................................................. G01R 31/26
[52] U.S. Cl. ........................................... 324/760; 324/765
[58] Field of Search ................................ 324/758, 760, 324/765

[56] References Cited

U.S. PATENT DOCUMENTS

5,650,732  7/1997  Sakai ....................................... 324/755

Primary Examiner—Glenn W. Brown
Attorney, Agent, or Firm—Staas & Halsey

[57] ABSTRACT

In an IC tester of the type in which ICs to be tested are heated by a planar heater plate 50 prior to being tested, a plate-like shutter 70 having windows 71 formed therethrough to expose IC receiving recesses 51 formed in the heater plate 50 is disposed movably over the top face of the heater plate. The arrangement is such that the shutter 70 is shifted by a linear drive source 74 between a position in which the shutter closes the top of the IC receiving recesses 51 and a position in which the shutter exposes the recesses. A controller is provided for actuating the drive source to move the shutter so as to open the IC receiving recesses, whenever a Z-axis drive unit 60 enters into either the operation of dropping off an IC grasped thereby into one of the IC receiving recesses or the operation of picking up an IC from one of the IC receiving recesses.

11 Claims, 7 Drawing Sheets

SEMICONDUCTOR DEVICE TESTING APPARATUS

BACKGROUND OF THE INVENTION

1. Field of the Invention

The present invention relates to a semiconductor device testing apparatus (commonly known as IC tester) for testing various types of semiconductor devices including semiconductor integrated circuits (commonly called IC), and more particularly to a semiconductor device transporting and handling apparatus (commonly known as handler), connected to the testing apparatus, for transporting various types of semiconductor devices to a test section to test them, and carrying the tested semiconductor devices out of the test section for transport to a desired location.

2. Description of the Related Art

As is well known, many of semiconductor device testing apparatus for testing various types of semiconductor devices including ICs have a semiconductor device transporting and handling apparatus (which will be referred to as handler hereinbelow) connected thereto for transporting semiconductor devices to be tested, i.e. devices under test (commonly called DUT) to the test section to be brought into electrical and mechanical contact with device-testing sockets, and after testing, carrying the tested semiconductor devices out of the test section for transport to a predetermined location. For simplicity of description, the semiconductor device testing apparatus will be described in the following disclosure by taking ICs which are typical of semiconductor devices by example.

First, one example of the semiconductor device testing apparatus of the type to which the present invention is intended to be applied will be described with reference to FIGS. 5 and 6.

Figure 5:
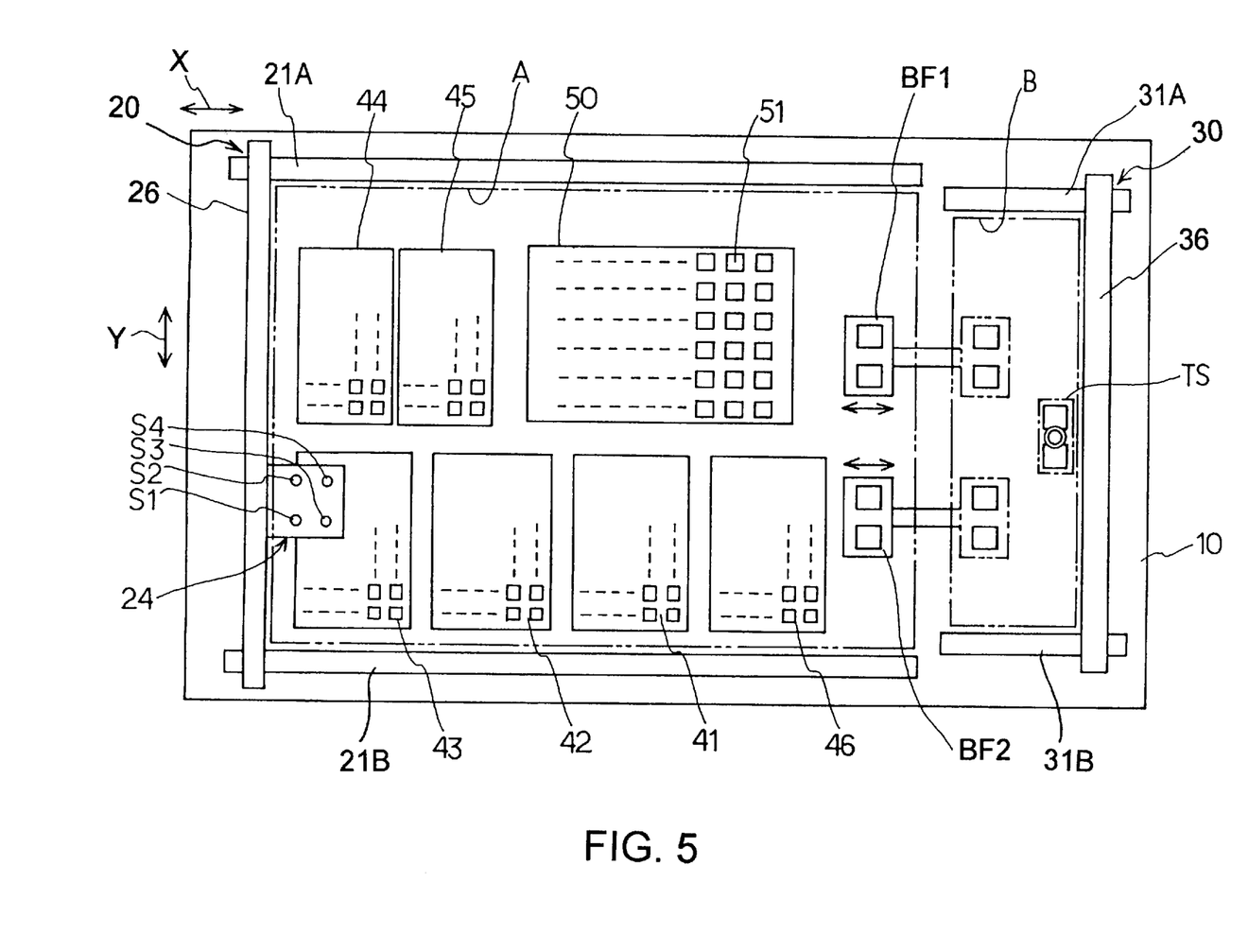
FIG. 5 is a plan view illustrating the principal parts of one example of the conventional semiconductor device testing apparatus.

FIG. 5 is a plan view illustrating the general construction of one example of the conventional semiconductor device testing apparatus (which will be referred to as IC tester hereinafter), particularly showing the general construction of the handler. This handler comprises a generally rectangular base plate 10, and first and second X-Y transport units 20 and 30 which are capable of transporting articles in both the X- and Y-axis directions, the first and second X-Y transport units 20 and 30 being disposed on the base plate 10 in longitudinally (in the right to left direction as viewed in the drawing) opposed relation to each other. The longitudinal direction is referred to as X-axis direction herein.

The first X-Y transport unit 20 includes a pair of first parallel X-axis rails 21A, 21B extending for a predetermined length in the X-axis direction over and along the opposite major lateral sides of the base plate 10 from adjacent the left end thereof as viewed in the drawing, a first movable arm 26 spanning the X-axis rails 21A, 21B orthogonally therewith and movably mounted on the rails in the X-axis direction therealong, and a first X-Y carriage 24 mounted on the movable arm 26 for movement therealong in the Y-axis direction.

The second X-Y transport unit 30 includes a pair of second parallel X-axis rails 31A, 31B extending for a predetermined length in the X-axis direction over and along the opposite major lateral sides of the base plate 10 from adjacent the left end thereof as viewed in the drawing, a second movable arm 36 spanning the X-axis rails 31A, 31B orthogonally therewith and movably mounted on the rails in the X direction therealong, and a second X-Y carriage (not shown) mounted on the movable arm 36 for movement therealong in the Y direction.

It will thus be understood that the first X-Y carriage 24 is movable by the first X-Y transport unit 20 constructed as described above to any desired point within the generally rectangular area (A) defined between the pair of first X-axis rails 21A, 21B as shown in dotted lines while the second X-Y carriage is likewise movable by the second X-Y transport unit 30 to any desired point within the generally rectangular area (B) defined between the pair of second X-axis rails 31A, 31B as shown in dotted lines. That is, the area (A) is the region within which the first X-Y transport unit 20 is capable of transporting articles while the area (B) is the transportable region of the second X-Y transport unit 30.

Disposed in the lower portion of the area (A) successively from the right side to the left side as viewed in the drawing are an empty tray storage section 46 for accommodating empty trays stacked one on another, a supply tray 41 loaded with ICs to be tested (ICs under test), two of the sorting trays 42 and 43 for sorting and storing tested ICs on the basis of the test results. The remaining two sorting trays 44 and 45, and a planar heater plate 50 for heating ICs under test to a predetermined temperature are disposed successively from the left to right side in the upper portion of the area (A) as viewed in the drawing. It is needless to say that the arrangement of the trays 41–45, the empty tray storage section 46 and the heater plate 50 and the number of the sorting trays 42–45 are illustrated herein as only one example and that they may be varied as required.

Disposed within the area (B) is the test section TS of the IC tester within which there are mounted IC sockets, although not shown, with which ICs under test are to be put into electrical contact. As the illustrated handler is configured to test two ICs under test at one time, the test section TS is equipped with two sockets.

The illustrated handler is further provided with first and second buffer stages BF1 and BF2, respectively which are reciprocally movable in the X-axis direction between a predetermined position in the area (A) and a predetermined position in the area (B). More specifically, the first buffer stage BF1 is reciprocally movable in the X-axis direction between that section within the area (A) adjacent the right hand side of the heater plate 50 and a predetermined position in the area (B) while the second buffer stages BF2 is reciprocally movable in the X-axis direction between that section within the area (A) adjacent the right hand side of the empty tray storage section 46.

The first buffer stage BF1 performs the function of transferring ICs under test heated to a predetermined temperature from the area (A) to the area (B) while the second buffer stage BF2 acts to carry the tested ICs from the area (B) to the area (A). It is to be understood that the provision of these buffer stages BF1 and BF2 permits the first and second X-Y transport units 20 and 30 to accomplish their transport operations with no interference with each other.

The first X-Y transport unit 20 described above is configured to convey ICs under test to the heater plate 50 for applying a predetermined thermal stress to the ICS, and then perform the operation of transferring the ICs under test heated to a predetermined temperature onto the first buffer stage BF1 and the operation of transferring the tested ICs from the second buffer stage BF2 onto the predetermined sorting trays which tested ICs have been transported from the area (B) to the area (A) by the second buffer stage BF2.

On the other hand, the second X-Y transport unit 30 is configured to perform the operation of transporting ICs under test as conveyed by the first buffer stage BF1 into the area (B) to the test section TS and the operation of transferring the tested ICs from the test section TS onto the second buffer stage BF2.

The heater plate 50 described above may be formed of plate-like metal stock for example, and is provided with a plurality of IC receiving recesses or pockets 51 for accommodating ICs under test. ICs to be tested are transported from the supply tray 41 into these IC receiving recesses 51 by the first X-Y transport unit 20. These IC receiving recesses 51 are typically arrayed in the form of a matrix composed of a plurality of rows and a plurality of columns. The heater plate 50 is maintained in an elevated temperature somewhat higher than the temperature to which ICs to be tested are to be applied. The ICs to be tested are thus heated to a predetermined temperature before being transported by means of the first buffer stage BF1 to the test section TS. The first and second X-Y transport units 20 and 30 are each provided with their own Z-axis drive units which perform the operation of picking up ICs out of the trays, the heater plate 50 or the test section TS (sockets) and the operation of dropping off ICs onto the trays, the heater plate 50 or the test section TS.

Figure 6:
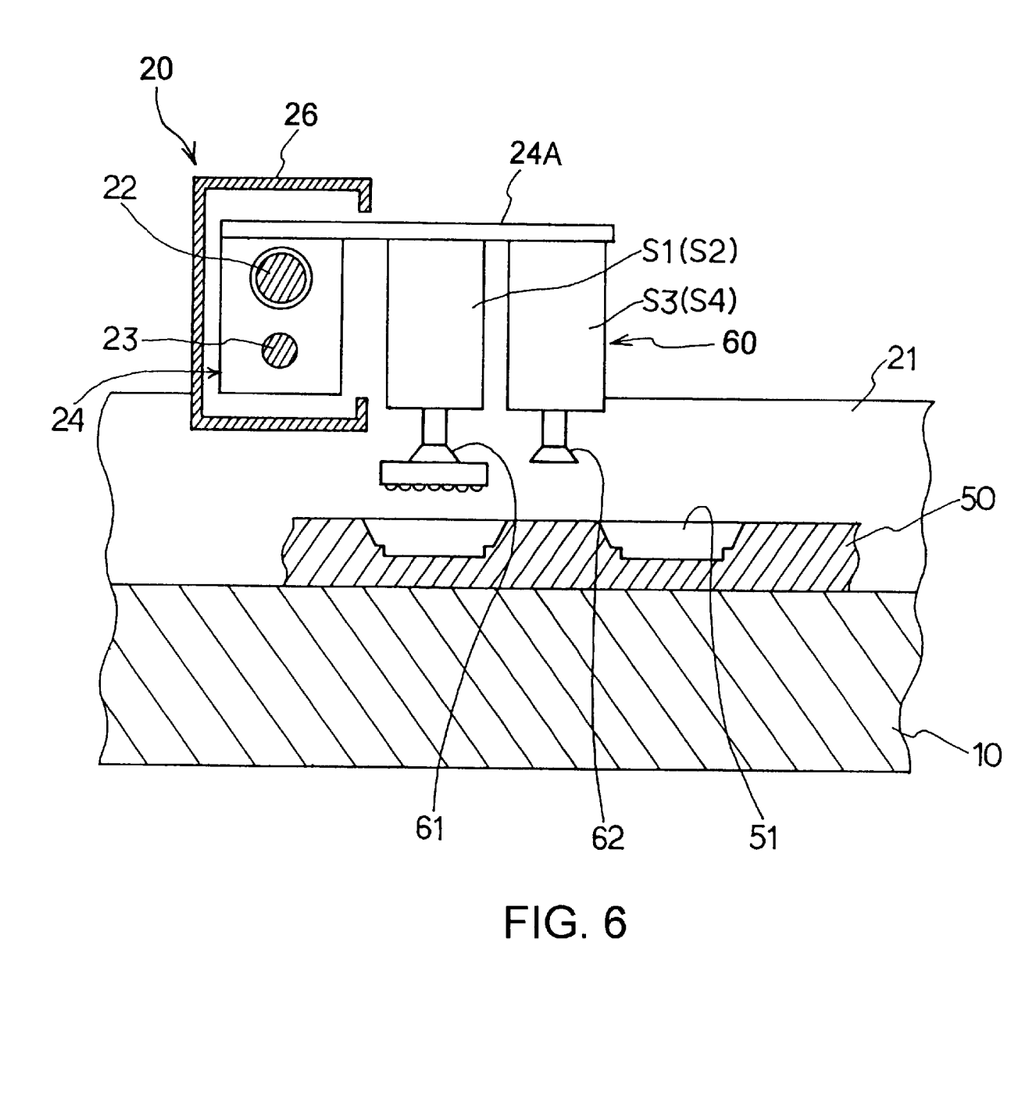
FIG. 6 is a cross-sectional view showing a portion of FIG. 5 in an enlarged form.

FIG. 6 illustrates the general construction of one example of the Z-axis drive unit 60 mounted on the first X-Y transport unit 20. As illustrated, the movable arm 26 extending in the Y-axis direction of the first X-Y transport unit 20 comprises a hollow member having a generally C-shaped cross-section, in the hollow interior of which a threaded shaft 22 and a guide shaft 23 likewise extending in the Y-axis direction are housed. Specifically, the threaded shaft 22 and guide shaft 23 extend in the Y-axis direction through the body portion of the first X-Y carriage 24 which is formed with threads engageable with the threads of the threaded shaft 22. The guide shaft 23 has no threads thereon so as to permit sliding movement of the body portion of the first X-Y carriage 24 relative to the guide shaft 23 which in turn acts to stabilize the movement of the X-Y carriage 24 in the Y-axis direction.

With the construction as described above, driven rotation of the threaded shaft 22 will move the first X-Y carriage 24 in the Y-axis direction in a stable manner. It is to be noted that the movement of the X-Y carriage 24 in the X-axis direction is effected by the movement of the movable arm 26 in the X-axis direction.

Extending horizontally (in the X-axis direction as viewed in FIG. 5) from the too of the body portion of the first X-Y carriage 24 is an arm 24A on the underside of which are vertically and downwardly mounted a plurality of (four in this example) first, second, third and fourth air cylinders S1, S2, S3 and S4, respectively, as shown in FIG. 5. In FIG. 6, the second air cylinder S2 is invisible as it is hidden behind the first air cylinder S1. Likewise, the fourth air cylinder S4 is invisible as it is hidden behind the third air cylinder S3. Each of the movable rods of the air cylinders S1, S2, S3 and S4 has a vacuum pick-up head mounted on its lower end.

While in the illustrated example the Z-axis drive unit 60 is adapted to actuate the first and second air cylinders S1 and S2 in a pair and the third and fourth air cylinders S3 and S4 in a pair so as to vacuum attract two ICs at a time thereagainst for transport, this is only an example.

One set of the first and second air cylinders S1 and S2 are employed to transport ICs under test heated to a predetermined temperature in the heater plate 50 to the first buffer stage BF1. In view of this, the vacuum pick-up heads 61 (shown as having ICs under test attracted thereagainst) mounted on the first and second air cylinders S1 and S2 are equipped with heaters (not shown) for maintaining the temperature of the heated ICs under test. The vacuum pick-up heads 62 mounted on the other set of the third and fourth air cylinders S3 and S4 are equipped with no heaters, because they are used to transport ICs at their normal temperature. Specifically, the vacuum pick-up heads 62 are used when transporting ICs from the supply tray 41 to the heater plate 50 and the tested ICs from the second buffer stage BF2 to corresponding one of the sorting trays 42, 43, 44 and 45.

The second carriage, not shown, mounted on the movable arm 36 of the second X-Y transport unit 30 is also provided with a Z-axis drive unit similar in construction to the Z-axis drive unit 60. However, since the second X-Y transport unit 30 is positioned in a mirror-image relation with the first X-Y transport unit 20, the movable arm 36 has a configuration symmetrical with respect to that of the movable arm 26 as shown in FIG. 6 (the movable arm 26 is open on its right-hand side whereas the movable arm 36 is open on its left-hand side), and four air cylinders are mounted on the left side of the movable arm 36. It should be noted that in the second carriage as well, the Z-axis drive unit is adapted to actuate the first and second air cylinders in a pair and the third and fourth air cylinders in a pair so as to vacuum attract two ICs at a time thereagainst for transport. One set of the air cylinders are employed when transporting ICs under test heated to a predetermined temperature from the first buffer stage BF1 to the test section TS. In view of this, the vacuum pick-up heads mounted on these cylinders are equipped with heaters for maintaining the temperature of the heated ICs under test. The vacuum pick-up heads 62 mounted on the other set of air cylinders are equipped with no heaters and are used when transporting ICs at their normal temperature, that is, from the test section TS to the second buffer stage BF1. It will be apparent to those skilled in the art the construction of the Z-axis drive unit may be modified in various ways.

As discussed above, this type of IC tester is configured to heat ICs to be tested to a predetermined temperature in the heater plate 50 and test the ICs while maintained at that predetermined temperature. There is a considerably high demand for the IC tester of the type utilizing a simplified type of heater means such as the heater plate 50 as described above, because of the high initial cost of the IC tester of the type utilizing a constant temperature chamber capable of maintaining ICs under test heated at a predetermined temperature and employing the test section TS enclosed in the constant temperature chamber to effect the testing.

Figure 7:
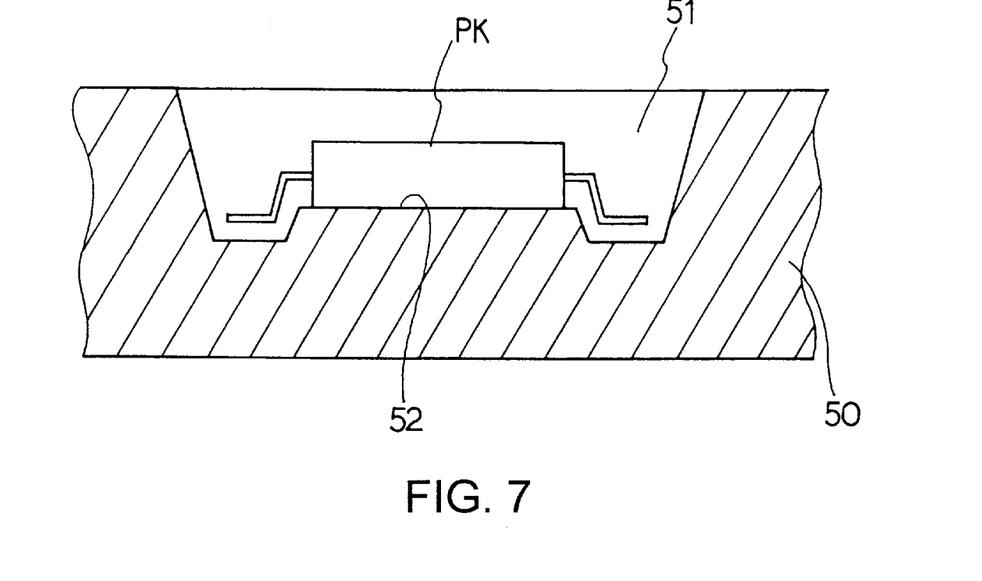
FIG. 7 is an enlarged cross-sectional view showing one form of the IC receiving recess in the heater plate used with the conventional semiconductor device testing apparatus of FIG. 5.

It should be here pointed out that in case the package of an IC to be tested is of a configuration having terminal pins from its four sides or opposed two sides as is the case with the surface-mounted type QFP (Quad Flat Package) or SOP (Small Outline Package) for example, the IC receiving recess 51 in the heater plate 50 may have a bottom 52 raised by a predetermined height as shown in FIG. 7 so as to provide a surface contact between the bottom 52 of the recess 51 and the bottom of the IC package PK and hence a sufficiently large area of contact between the IC package PK and the heater plate 50 in the IC receiving recess 51 to permit the IC to be heated to a desired temperature approximating to the temperature of the heater plate 50.

Figure 8:
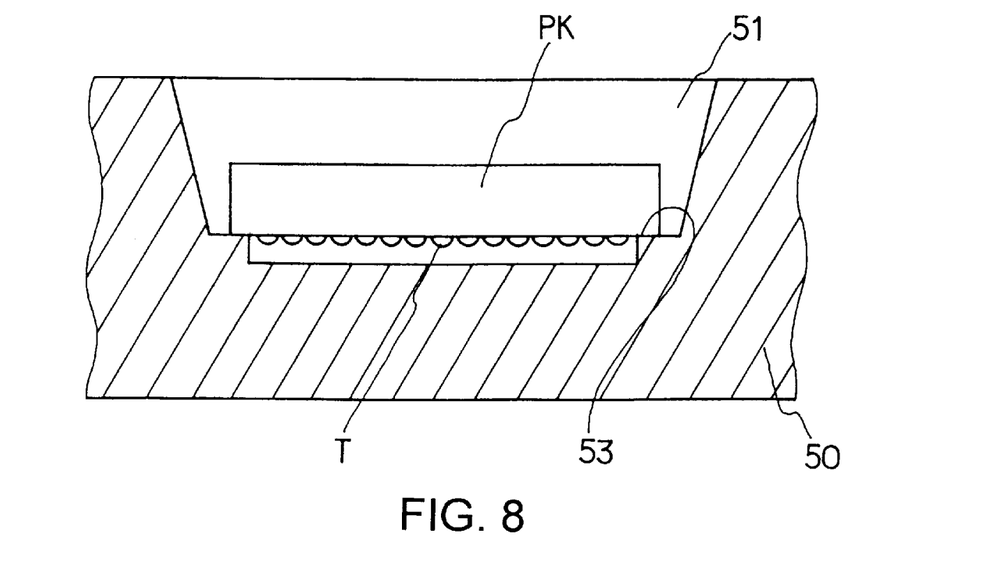
FIG. 8 is an enlarged cross-sectional view showing another form of the IC receiving recess in the heater plate used with the conventional semiconductor device testing apparatus of FIG. 5.

In contrast, the package of area array IC such as the BGA (Ball Grid Array) package and the CSP (Chip Size Package) has terminals (electrodes) formed over approximately the entire surface area of the mounting side (the bottom surface of the package), so that it is impossible to place that portion of the undersurface of the IC package PK formed with terminals T in direct contact with the bottom surface of the IC receiving recess 51 in the heater plate 50, as seen in FIG. 8. For this reason, the bottom surface of the IC receiving recess 51 is formed with a stepped ledge 53 for supporting the outer margin of that portion of the undersurface of the IC package PK formed with terminals T so as to lift the terminals T off the bottom of the IC receiving recess 51.

However, if the IC receiving recesses 51 were constructed with such stepped ledges 53, the surface areas of contact between the IC packages PK and the heater plate 50 in the IC receiving recesses 51 would be undesirably reduced, resulting in failure to heat the ICs to a desired temperature.

More specifically, while in this type of IC tester it is a common practice to heat ICs under test to 125° C. or over for example, the ultimate temperature that the ICs under test could reach with the IC receiving recesses 51 as constructed as shown in FIG. 8 was limited to around 115° C. if the heater plate 50 had a surface temperature of 130° C., but it was not possible to raise the temperature of the ICs to be tested beyond 125° C.

In view of this while it was proposed to set the surface temperature of the heater plate 50 at a higher level, to that end it required that those parts of the handler to be contacted with the heater plate 50 and the vacuum pick-up heads equipped with heaters have an increased heat resistance, leading undesirably to an increase in the cost of manufacture. In addition, the program for controlling the temperature of the heater plate 50 need be modified, requiring cumbersome operations and time.

SUMMARY OF THE INVENTION

It is an object of the present invention to provide a semiconductor device testing apparatus of the type in which semiconductor devices are heated by being placed in contact with a heater prior to being subjected to the testing and which is capable of raising the temperature of the semiconductor devices to a temperature approximating to that of the heater.

In order to accomplish the aforesaid object, in one aspect of the present invention, there is provided a semiconductor device testing apparatus comprising: a heating means including a heater having a plurality of device receiving recesses for accommodating semiconductor devices to be tested and heating the semiconductor devices in the device receiving recesses of the heater to a predetermined temperature; X-Y-Z transport means capable of transporting semiconductor devices in both horizontal and vertical directions for transporting semiconductor devices to be tested to the device receiving recesses of the heater, and then transporting the semiconductor devices accommodated in the device receiving recesses successively to a test section; and means for storing tested semiconductor devices as carried out of the test section, the semiconductor device testing apparatus being characterized by further comprising: a shutter having at least one window formed therethrough, the shutter being disposed movably over the top face of the heater such that upon being moved to and stopped at a position in which the at least one window is in opposition to at least one particular recess of the device receiving recesses, the shutter exposes the at least one particular recess while closing the remaining device receiving recesses; and a drive source for moving the shutter.

In a preferred embodiment of the invention, the testing apparatus further includes a control means for actuating the drive source to move the shutter so that the window is positioned opposite to a predetermined one of the device receiving recesses to expose the predetermined device receiving recess whenever the X-Y-Z transport means enters into either the operation of dropping off a semiconductor device grasped thereby into a predetermined device receiving recess or the operation of picking up a semiconductor device from a predetermined device receiving recess.

The heater comprises a planar heater plate in which the device receiving recesses are formed in the form of a matrix consisting of a plurality of transverse rows and a plurality of longitudinal columns arranged with predetermined pitches, respectively.

Further, the shutter is formed of a plate-like member of a material having thermal insulation and heat resistance, and the windows are formed through the plate-like member in the form of a matrix consisting of a plurality of transverse rows and a plurality of longitudinal columns arranged with substantially the same pitch as that of the device receiving recesses so that those windows may open all of the device receiving recesses simultaneously.

In a first modified form, the shutter is formed of a plate-like member of a material having thermal insulation and heat resistance, and at least one longitudinal column of windows are formed through the plate-like member with substantially the same pitch as that of the device receiving recesses so that the windows may expose at least one of the plurality of longitudinal columns of device receiving recesses simultaneously.

In a second modified form, the shutter is formed of a plate-like member of a material having thermal insulation and heat resistance, at least one transverse row of windows are formed through the plate-like member with substantially the same pitch as that of the device receiving recesses so that the windows may expose at least one of the plurality of transverse rows of device receiving recesses simultaneously.

In a third modified form, the shutter is formed of a flexible sheet-like member of a material having thermal insulation and heat resistance, at least one longitudinal column of windows are formed through the sheet-like member with substantially the same pitch as that of the device receiving recesses so that the windows may expose at least one of the plurality of longitudinal columns of device receiving recesses simultaneously, and the drive source is adapted to drive the sheet-like member in a winding-up manner at its opposite ends.

Alternatively, at least one transverse row of windows may be formed through the sheet-like member with substantially the same pitch as that of the device receiving recesses so that the windows may expose at least one of the plurality of transverse rows of device receiving recesses simultaneously.

In a yet further modified form, the shutter may comprise a plurality of independently movable flexible sheet-like members of a material having thermal insulation and heat resistance, and the sheet-like members are adapted to cover the corresponding longitudinal columns of device receiving recesses formed in the planar heater plate. At least one window is formed through each of the sheet-like members, and the drive source may be adapted to drive the plurality of sheet-like members independently of each other in a winding-up manner at their opposite ends.

With the construction according to the present invention as described above, the openings of a plurality of semiconductor device receiving recesses formed in the heater are normally closed by a shutter disposed over the top face of the heater. It is only when semiconductor devices to be tested are transferred to the heater and when heated semiconductor devices to be tested are removed from the heater that the shutter is opened. Therefore, the interior of the semiconductor device receiving recesses are placed in the temperature condition similar to that within the conventional constant temperature chamber, whereby it is possible to raise the temperature of a semiconductor device to a temperature close to that of the heater, even if the semiconductor device has such an arrangement of terminals as to prevent a sufficiently large direct contact being provided between the semiconductor device and the heater.

DETAILED DESCRIPTION OF THE PREFERRED EMBODIMENTS

Figure 1:
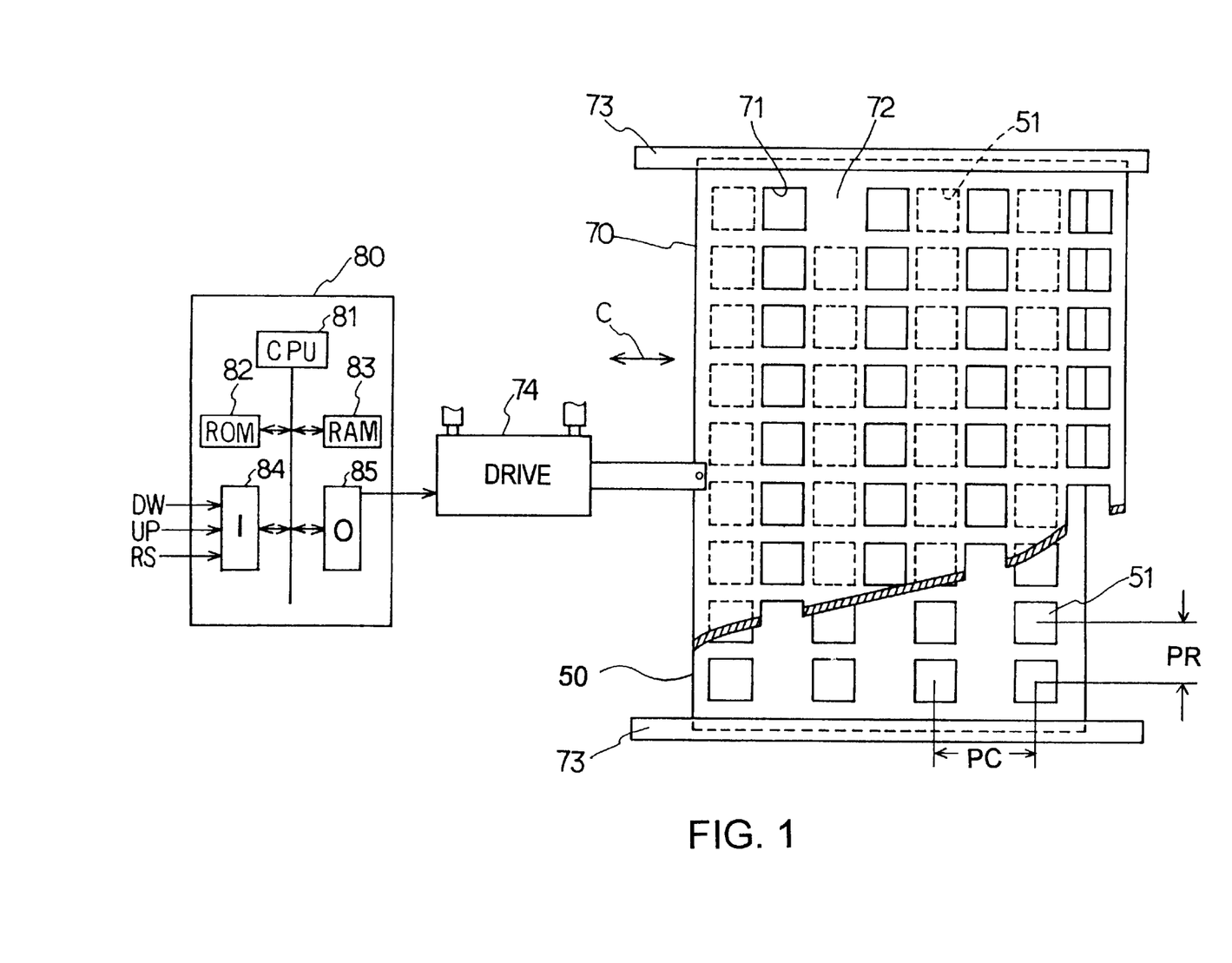
FIG. 1 is a schematic plan view illustrating the principal parts of one embodiment of the semiconductor device testing apparatus according to the present invention together with the control system shown in a block diagram.

FIG. 1 is a plan view illustrating the heating apparatus which constitutes the principal part of one embodiment of the semiconductor device testing apparatus according to this invention and a block diagram of the control system for the heating apparatus. The heating apparatus is means for heating ICs under test to a predetermined temperature and in this embodiment comprises a heater plate 50 formed of a plate-like metal stock, a plate-like shutter 70 covering the face of the heater plate 50, and a pair of guides 73, 73 for stabilizing the movement of the shutter 70 in the direction (right to left direction) shown by the arrow C in FIG. 1.

The heater plate 50 is formed with IC receiving recesses or pockets 51 arrayed in the form of a matrix (9 rows×4 columns in the illustrated example) consisting of rows (transverse rows) and columns (longitudinal columns) arranged with predetermined pitches or spacings, respectively, in a conventional manner. In this case, either the pitch PR (or the spacing between adjacent two receiving recesses in one longitudinal column) between the transverse rows of the IC receiving recesses 51 or the pitch PC (or the spacing between adjacent two receiving recesses in one transverse row) between the longitudinal columns of the IC receiving recesses 51 is sized so as to be greater than the dimension (length or width) of each of the IC receiving recesses 51 as measured either in the column direction (perpendicular to the direction C) or in the row direction (the direction C). The illustrated example represents the case wherein the pitch PC (or the spacing between adjacent two receiving recesses in one longitudinal column) between the columns of the IC receiving recesses 51 is sized so as to be greater than the dimension (length or width) of each of the IC receiving recesses 51 as measured in the row direction (the direction C). Of course, both of the pitches PR and PC may be sized so as to be greater than the dimension (length or width) of the IC receiving recess 51 as measured in the column direction and row direction, respectively. It is also to be noted that the IC receiving recesses 51 may be of the configuration similar to those of the conventional IC receiving recesses described hereinabove with respect to FIGS. 7 and 8.

The shutter 70 covering the face of the heater plate 50, hence the top openings of all the IC receiving recesses 51 may be formed of stainless steel plate having a thickness of about 0.5–1.0 mm for example or a plate of any other material having an appropriate thermal insulation and heat resistance, and is formed with windows 71 having dimensions equal to or somewhat greater than the openings of the IC receiving recesses 51 and arrayed in the form of a matrix (9 rows×4 columns in the illustrated example) at the positions corresponding to the openings of the IC receiving recesses 51. Otherwise stated, the windows 71 formed through the shutter 70 in a matrix-like arrangement have the pitch (the spacing) between the transverse rows approximately equal to the pitch PR (or the spacing) between the transverse rows of the IC receiving recesses 51 formed in the heater plate 50 and have the pitch (the spacing) between the longitudinal columns approximately equal to the pitch PC (or the spacing) between the longitudinal columns of the IC receiving recesses 51.

The shutter 70 having the configuration as described above is positioned so as to overlie the face of the heater plate 50, and is coupled with a linear drive source 74 such as an air cylinder. The linear drive source 74 is operative to move the shutter 70 in the direction indicated by the arrow C across the heater plate 50 while it is guided by the guides 73, 73. These guides 73 are in engagement with the upper and lower end edges of the shutter 70 as viewed in the drawing so as to support the shutter 70 for movement while maintained in an attitude parallel to the heater plate 50.

In the illustrated example, the linear drive source 74 is adapted to move the shutter 70 reciprocally in the direction C between two positions. One of the positions is the position in which all the windows 71 in the shutter 70 are in coincidence with the IC receiving recesses 51 in the heater plate 50. This position permits access to the IC receiving recesses 51 for placing and removing ICs into and out of the recesses, as the openings of all the IC receiving recesses 51 are exposed. The other position is the position shown in FIG. 1 in which all the windows 71 in the shutter 70 are completely offset from (completely out of coincidence with) the IC receiving recesses 51 in the heater plate 50. The shutter 70 when shifted into this position closes the openings of all the IC receiving recesses 51 in the heater plate 50. It is thus to be appreciated that in the illustrated example, the solid portions (devoid of the windows 71) extending between the windows 71 in the shutter 70 in the column direction define closure portions (only one of which is designated at 72 in FIG. 1) for shuttering the IC receiving recesses 51. Although in FIG. 1 the IC receiving recess 51 is not shown in phantom lines at the location corresponding to one part of the closure portion 72 for the benefit of clearly showing the closure portion, it should be understood that that portion of the heater plate 50 corresponding to this closure portion 72 is actually formed with an IC receiving recess 51.

By way of example, when the linear drive source 74 is an air cylinder operative both in the sense to push the shutter 70 and in the sense to pull the shutter, driving the linear drive source 74 in the pulling sense will shift the shutter 70 to the aforesaid one position in which all the windows 71, in the shutter 70 are in opposition to the corresponding IC receiving recesses 51 in the heater plate 50 whereas driving the linear drive source 74 in the pushing sense will shift the shutter 70 to the aforesaid other position in which the closure portions 72 of the shutter 70 are in opposition to all of the IC receiving recesses 51 in the heater plate 50 to close all the IC receiving recesses 51.

The linear drive source 74 is normally actuated in the pushing sense to hold the shutter 70 at a standstill in the position in which the closure portions 72 of the shutter 70 are in opposition to all the IC receiving recesses 51 in the heater plate 50, that is, the position in which the shutter 70 closes all the IC receiving recesses 51. However, when the Z-axis drive unit 60 mounted on the first X-Y carriage 24 of the first X-Y transport unit 20 as described before with respect to FIGS. 5 and 6 is moved to a position overlying the heater plate 50 with the vacuum pick-up heads 62 in a position either to drop off ICs under test grasped thereby into predetermined IC receiving recesses 51 in the heater plate 50 or to pick up heated ICs under test from predetermined IC receiving recesses 51 in the heater plate 50, the linear drive source 74 is actuated in the pulling sense to shift the shutter 70 to the position in which all the windows 71 in the shutter 70 overlie the corresponding IC receiving recesses 51 in the heater plate 50 to expose the openings of all the IC receiving recesses 51.

The Z-axis drive unit 60 of the first X-Y carriage 24 is thus permitted to either drop off ICs under test into predetermined IC receiving recesses 51 in the heater plate 50 or vacuum pick up heated ICs under test from predetermined IC receiving recesses 51 in the heater plate 50 through the windows 71 in the shutter 70.

The operation of the aforesaid linear drive source 74 is controlled by a controller 80 as shown in FIG. 1. The controller 80 is constituted by a microcomputer and comprises a central processing unit (CPU) 81, a read-only memory (ROM) 82 storing programs, etc., a writable and readable random-access memory (RAM) 83 for temporarily storing position input data, etc., an input port 84, and an output port 85. The operation of the controller 80 will now be briefly described. When the controller 80 is provided through the input port 84 with either a control signal DW instructing the controller to move the Z-axis drive unit 60 (see FIG. 6) to over the heater plate 50 to cause the vacuum pick-up heads 62 to drop off ICs under test grasped thereby or a control signal UP instructing the controller to cause the vacuum pick-up heads 62 to pick up heated ICs to be tested from the heater plate 50, the central processing unit 81 decodes either the control signal DW or UP and provides a control signal through the output port 85 to the linear drive source 74 to be driven in the sense to pull the shutter 70, whereupon the linear drive source 74 moves the shutter 70 to the left as viewed in the drawing to bring all the windows 71 in the shutter 70 into coincidence with the corresponding IC receiving recesses 51 to open all the IC receiving recesses 51 through the windows 71.

When a control signal RS is input through the input port 84 to the controller 80 indicating that the vacuum pick-up heads 62 of the Z-axis drive unit 60 have either dropped off ICs under test grasped thereby into predetermined IC receiving recesses 51 or picked up heated ICs under test from predetermined IC receiving recesses 51 and returned to their original positions, the central processing unit 81 decodes the control signal RS and provides a control signal through the output port 85 to the linear drive source 74 to be driven in the sense to push the shutter 70, whereupon the linear drive source 74 moves the shutter 70 to the right as viewed in the drawing to shift the shutter to the position (shown in FIG. 1) in which all the windows 71 in the shutter 70 are completely offset from the corresponding IC receiving recesses 51. That is, the closure portions 72 of the shutter 70 are positioned opposite to all the IC receiving recesses 51 to thereby close the tops of all the IC receiving recesses 51 in the heater plate 50.

It will be appreciated from the foregoing that ICs under test accommodated in the IC receiving recesses 51 are placed in the condition equivalent to that in which they would be if they were contained in the interior of the conventional constant temperature chamber, owing to the planar shutter 70 movably mounted over the top face of the heater plate 50 and normally positioned such that the tops (openings) of all the IC receiving recesses 51 in the heater plate 50 are closed by the shutter 70. Consequently, ICs under test are heated not only through direct contact of their packages with the heater plate 50 but also by the heated atmosphere within the IC receiving recesses 51. It can thus be appreciated that even if the package of the IC under test is of such configuration having a limited surface area in direct contact with the heater plate 50 as shown in FIG. 8, the present invention makes it possible to heat the IC to a temperature approximating to that of the heater plate 50.

Experiments showed that for the IC of the BGA configuration as shown in FIG. 8, when the surface temperature of the heater plate 50 was maintained at 130° C., the ultimate temperature that the IC reached with the conventional heater plate devoid of the shutter 70 was 115° C. whereas the ultimate temperature of the IC heated by the use of the heater plate provided with the shutter 70 of the construction as described above was 129° C. This demonstrates that the effects provided by the present invention are remarkable.

While in the embodiment described above the shutter 70 covering the face of the heater plate 50 is formed with windows 71 equal in size to or somewhat greater than the openings of the IC receiving recesses 51 in the form of a matrix at the positions corresponding to the openings of all of the IC receiving recesses 51, it is not necessarily required to provide the shutter 70 with such windows 71 at the positions corresponding to the openings of all of the IC receiving recesses 51. Because, since the number of ICs which are deposited into or removed from IC receiving recesses 51 at one time is usually one to about four, it will be sufficient if the shutter 70 is formed with as many windows 71 as ICs which are to be deposited into or picked up from IC receiving recesses 51 at one time. In so doing, the additional advantage is obtained that the temperature of the IC receiving recesses 51 which need not be opened at the particular time is not lowered unnecessarily.

Figure 2:
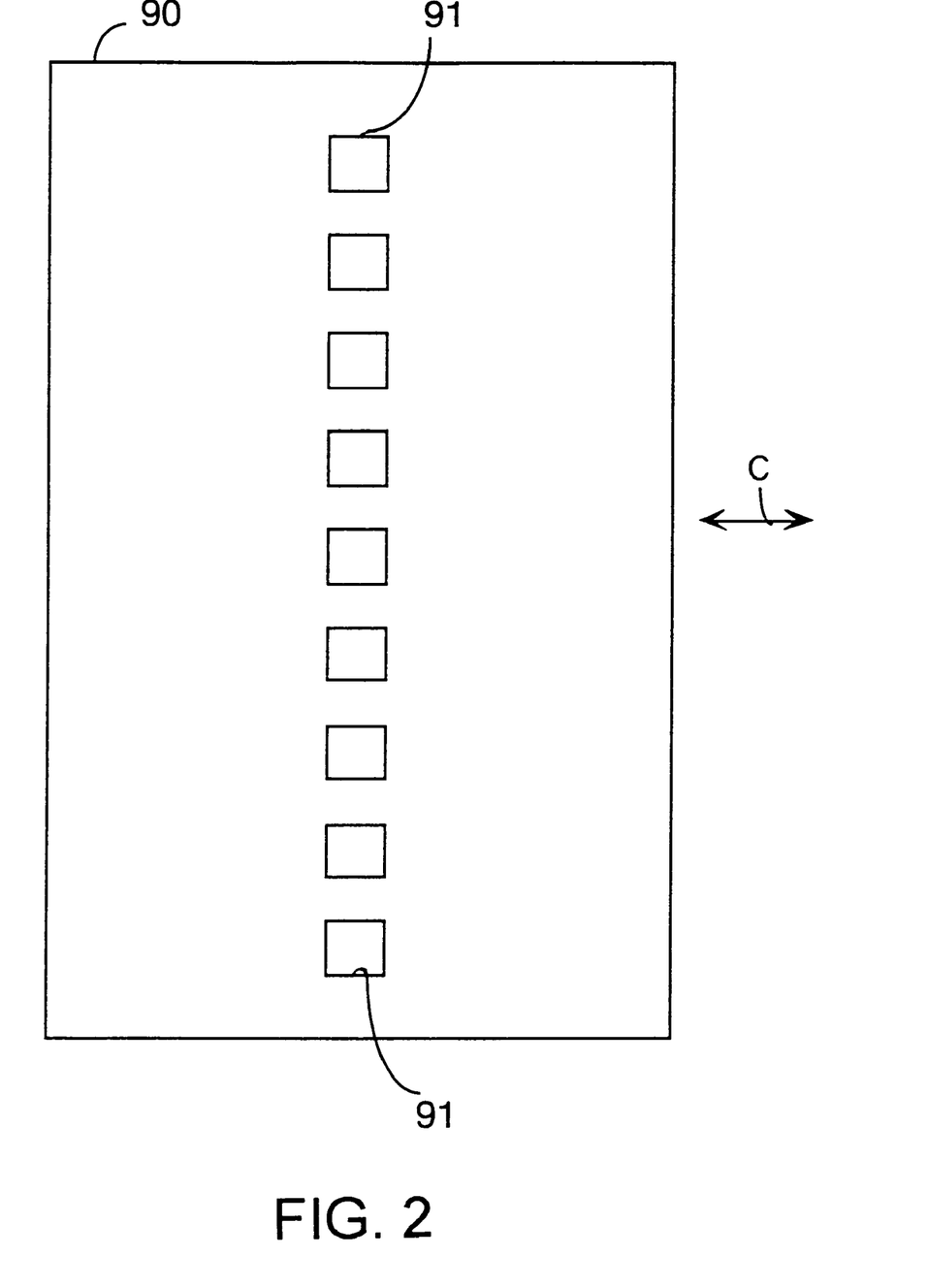
FIG. 2 is a schematic plan view illustrating a first modified form of the shutter of the heating apparatus used in the semiconductor device testing apparatus of FIG. 1.

FIG. 2 shows a first modified form of the shutter. The shutter 90 in this form is also formed of stainless steel plate having a thickness of about 0.5–1.0 mm for example or a plate of any other material having an appropriate thermal insulation and heat resistance, as is the case with the shutter 70 shown in FIG. 1. The shutter 90 is formed approximately in the central portion thereof with a longitudinal column of windows 91 arrayed in the direction (the up to down direction as viewed in the drawing) perpendicular to the direction indicated by the arrow C with a pitch (spacing) approximately equal to the pitch PR (spacing) between the transverse rows of IC receiving recesses 51 formed in the heater plate 50. The shutter 90 is adapted to be moved reciprocally and incrementally in the direction C (the right to left direction in the drawing) such that the single longitudinal column of windows 91 may be shifted and positioned oppositely to any desired one of the longitudinal columns of IC receiving recesses 51. In other words, the arrangement is such that the shutter 90 may be shifted incrementally with the pitch equal to the pitch PC (spacing) between the longitudinal columns of IC receiving recesses 51. The dimension of the shutter 90 as measured in the direction of movement thereof (the right to left direction) is sized such that when the single longitudinal column of windows 91 is moved outward beyond either the leftmost or rightmost one of the longitudinal columns of IC receiving recesses 51, all of the IC receiving recesses 51 are closed by the shutter 90. Forming the windows 91 approximately in the central portion of the shutter 90 may reduce the required dimension of the shutter 90 as measured in the direction of movement thereof.

It will be apparent that the use of the shutter 90 constructed as described above may provide the functional advantages comparable with those obtained by the shutter 70 used in the embodiment shown in FIG. 1, and further description of the shutter 90 is omitted.

Figure 3:
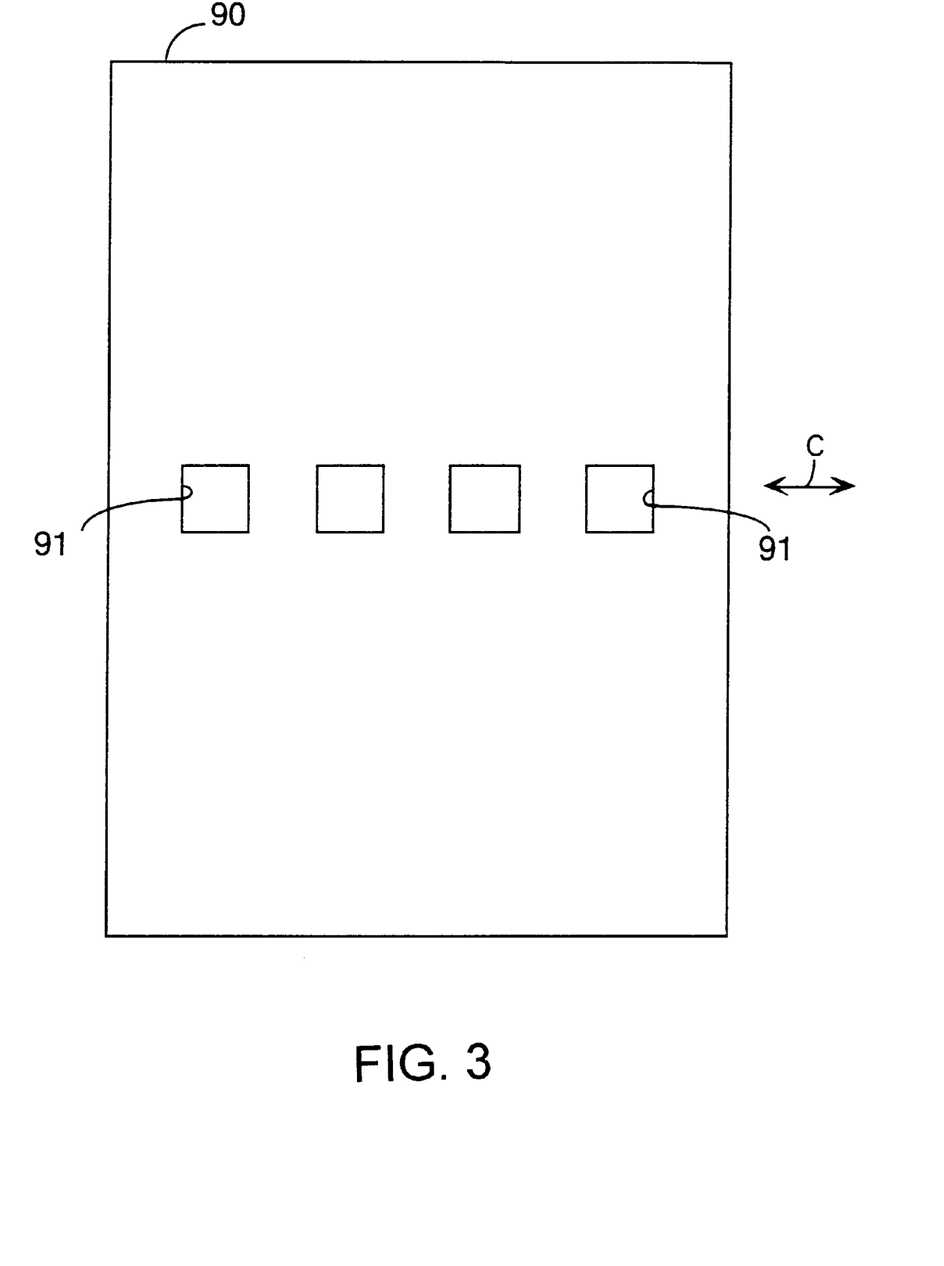
FIG. 3 is a schematic plan view illustrating a second modified form of the shutter of the heating apparatus used in the semiconductor device testing apparatus of FIG. 1.

FIG. 3 shows a second modified form of the shutter. While in the first modified form shown in FIG. 2 a single longitudinal column of windows 91 is formed in the shutter 90 in the up to down direction as viewed in the drawing perpendicular to the direction C, a single transverse row of windows 91 may be formed in the shutter 90 in the right to left direction as viewed in the drawing (direction C), as shown in FIG. 3.

The shutter 90 in this form is also made of stainless steel plate having a thickness of about 0.5–1.0 mm for example or a plate of any other material having an appropriate thermal insulation and heat resistance, as is the case with the shutter 70 shown in FIG. 1. The single transverse row of windows 91 is formed in the shutter 90 with a pitch (spacing) approximately equal to the pitch PC (spacing) between the longitudinal columns of IC receiving recesses 51 formed in the heater plate 50. The shutter 90 is adapted to be moved reciprocally and incrementally in the direction perpendicular to the direction C (the up to down direction as viewed in the drawing) such that the single transverse row of windows 91 may be shifted and positioned oppositely to any desired one of the transverse rows of IC receiving recesses 51. In other words, the arrangement is such that the shutter 90 may be shifted incrementally with the pitch equal to the pitch PR (spacing) between the transverse rows of IC receiving recesses 51.

The dimension of the shutter 90 as measured in the direction of movement thereof (the up to down direction) is sized such that when the single transverse row of windows 91 is moved outward beyond either the uppermost or lowermost one of the transverse rows of IC receiving recesses 51, all of the IC receiving recesses 51 are closed by the shutter 90. Forming the windows 91 approximately in the central portion of the shutter 90 as in the modified form of FIG. 2 may reduce the required dimension of the shutter 90 as measured in the direction of movement thereof. In the modified form of FIG. 3, a pair of guides (not shown) are provided to slidably support the left and right end edges of the shutter 90 as viewed in the drawing.

It will be apparent that the use of the shutter 90 constructed as described just above may provide the functional advantages comparable with those obtained by the shutter 70 used in the embodiment shown in FIG. 1, and further description of the shutter 90 is omitted.

A single longitudinal column of windows 91 is formed in the shutter 90 in the up to down direction as viewed in the drawing (perpendicular to the direction C) in the first modified form and a single transverse row of windows 91 is formed in the shutter 90 in the right to left direction as viewed in the drawing (direction C) in the second modified form. However, when the heater plate 50 has a relatively great number of IC receiving recesses 51 formed therein, it is preferable that an appropriate number of longitudinal columns or transverse rows of windows less than the number of the longitudinal columns or the transverse rows of IC receiving recesses 51 be formed through the shutter with predetermined intervals, since such arrangement can reduce the required distance of travel as well as the dimension of the shutter 90.

Further while the plate-like shutter 70 or 90 is used in the embodiment and the modified forms as described above, it is possible to use a shutter in the form of a sheet of material having flexibility as well as thermal insulation and heat resistance. In that case, instead of a linear drive source, a motor-driven wind-up mechanism may be used to wind up the sheet-like shutter at its opposite ends so as to move single longitudinal column or transverse row of or a plurality of longitudinal columns or transverse rows of windows formed through the shutter.

Figure 4:
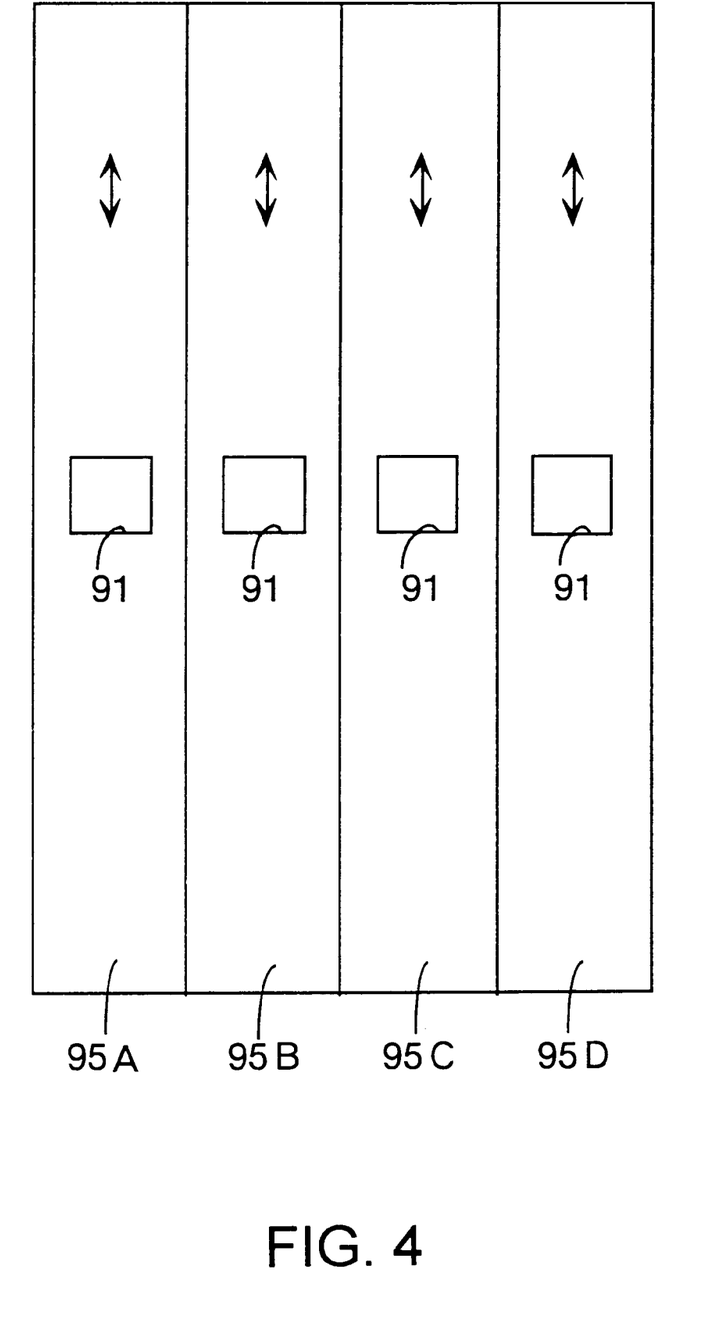
FIG. 4 is a schematic plan view illustrating a third modified form of the shutter of the heating apparatus used in the semiconductor device testing apparatus of FIG. 1.

In a yet modified form, as shown in FIG. 4, a plurality of independently movable sheet-like or web-like shutter segments 95A, 95B, 95C, 95D adapted to cover the corresponding longitudinal columns of IC receiving recesses 51 formed in the heater plate 50 may be employed. Each of the web-like shutter segments or strips 95A, 95B, 95C, 95D may have a single window 91 formed therethrough and be configured to be wound up at its opposite ends by a motor-driven wind-up mechanism so as to move the single window 91. This configuration permits the IC receiving recesses 51 to be opened one by one. Alternatively, a plurality of windows 91 may be formed through each web-like shutter strip. While in the configuration of FIG. 4 four web-like strips 95A, 95B, 95C, 95D are provided since four longitudinal columns of IC receiving recesses 51 are formed in the heater plate 50 illustrated in FIG. 1, it is a matter of course that the number of the web-like strips may be varied depending on the number of the longitudinal columns of the IC receiving recesses 51.

It will also be apparent that in the third modified form shown in FIG. 4, a plurality of independently movable sheet-like shutter strips each adapted to cover the corresponding one of the transverse rows of IC receiving recesses 51 formed in the heater plate 50 may be employed with equivalent functional effects. Each of the shutter strips may have a single or a plurality of windows 91 formed therethrough.

While in the foregoing disclosure the invention has been described by taking the IC which is typical of semiconductor devices by example, it will be apparent to those skilled in the art that the present invention is, with expected equivalent functional advantages, applicable to semiconductor device testing apparatus designed for testing semiconductor devices other than ICs.

As discussed hereinabove, according to the present invention, since the open tops of a plurality of IC receiving recesses formed in the planar heater of the heating apparatus are normally closed by a shutter in the form of a plate or sheet or web, the semiconductor devices accommodated in the IC receiving recesses are placed in the condition equivalent to that in which they would be if they were contained in the interior of the conventional constant temperature chamber. It can thus be appreciated that the present invention provides the marked advantage that in a less expensive semiconductor device testing apparatus utilizing a simple heating means such as the planar heater plate, semiconductor devices, even if they are housed in a package having a limited surface area in direct contact with the heater plate, may be adequately heated to a temperature approximating to that of the heater plate.

What is claimed is:

1. A semiconductor device testing apparatus comprising:

heating means including a heater having a plurality of device receiving recesses formed therein for accommodating semiconductor devices to be tested and heating said semiconductor devices in said device receiving recesses of said heater to a predetermined temperature;

X-Y-Z transport means capable of transporting semiconductor devices in both horizontal and vertical directions for transporting semiconductor devices to be tested to said device receiving recesses of said heater, and then transporting the semiconductor devices accommodated in said device receiving recesses of said heater successively to a test section; and means for storing tested semiconductor devices as carried out of said test section, said semiconductor device testing apparatus being characterized by further comprising:

a shutter having at least one window formed therethrough, said shutter being disposed movably over the top face of said heater such that upon being moved to and stopped at a position in which said at least one window is in opposition to at least one particular recess of said device receiving recesses, said shutter exposes said at least one particular recess while closing the remaining device receiving recesses; and a drive source for moving said shutter.

2. The semiconductor device testing apparatus according to claim 1, further including a control means for actuating said drive source to move said shutter so that said at least one window is positioned opposite to at least one particular recess of said device receiving recesses to expose the at least one particular recess whenever said X-Y-Z transport means enters into either the operation of dropping off a semiconductor device grasped by said X-Y-Z transport means into a predetermined one of said device receiving recesses of said heater or the operation of picking up a semiconductor device from a predetermined one of said device receiving recesses of said heater.

3. The semiconductor device testing apparatus according to claim 1, wherein said heater comprises a planar heater plate in which said device receiving recesses are formed in the form of a matrix consisting of a plurality of transverse rows and a plurality of longitudinal columns arranged with predetermined pitches, respectively.

4. A semiconductor device testing apparatus according to claim 3, wherein said shutter is formed of a plate-like member of a material having thermal insulation and heat resistance, at least one longitudinal column of windows being formed through said plate-like member with substantially the same pitch as that of said device receiving recesses so that said windows may expose at least one of said plurality of longitudinal columns of device receiving recesses simultaneously.

5. A semiconductor device testing apparatus according to claim 3, wherein said shutter is formed of a plate-like member of a material having thermal insulation and heat resistance, at least one transverse row of windows being formed through said plate-like member with substantially the same pitch as that of said device receiving recesses so that said windows may expose at least one of said plurality of transverse rows of device receiving recesses simultaneously.

6. A semiconductor device testing apparatus according to claim 3, wherein said shutter is formed of a plate-like member of a material having thermal insulation and heat resistance, a plurality of transverse rows and a plurality of longitudinal columns of windows being formed through said plate-like member with substantially the same pitch as that of said device receiving recesses so that said windows may expose all of said device receiving recesses simultaneously.

7. A semiconductor device testing apparatus according to claim 3, wherein said shutter is formed of a flexible sheet-like member of a material having thermal insulation and heat resistance, at least one longitudinal column of windows being formed through said sheet-like member with substantially the same pitch as that of said device receiving recesses so that said windows may expose at least one of said plurality of longitudinal columns of device receiving recesses simultaneously, and said drive source comprising a drive source for driving said sheet-like member in a winding-up manner at its opposite ends.

8. A semiconductor device testing apparatus according to claim 3, wherein said shutter is formed of a flexible sheet-like member of a material having thermal insulation and heat resistance, at least one transverse row of windows being formed through said sheet-like member with substantially the same pitch as that of said device receiving recesses so that said windows may expose at least one of said plurality of transverse rows of device receiving recesses simultaneously, and said drive source comprising a drive source for driving said sheet-like member in a winding-up manner at its opposite ends.

9. A semiconductor device testing apparatus according to claim 3, wherein said shutter is formed of a flexible sheet-like member of a material having thermal insulation and heat resistance, a plurality of transverse rows and a plurality of longitudinal columns of windows being formed through said plate-like member with substantially the same pitch as that of said device receiving recesses so that said windows may expose all of said device receiving recesses simultaneously, and said drive source comprising a drive source for driving said sheet-like member in a winding-up manner at its opposite ends.

10. A semiconductor device testing apparatus according to claim 3, wherein said shutter comprises a plurality of independently movable flexible sheet-like members of a material having thermal insulation and heat resistance, said sheet-like members being adapted to cover the corresponding longitudinal columns of device receiving recesses formed in said planar heater plate, at least one window being formed through each of said sheet-like members, and said drive source comprising a drive source for driving said plurality of sheet-like members independently of each other in a winding-up manner at their opposite ends.

11. A semiconductor device testing apparatus according to claim 3, wherein said shutter comprises a plurality of independently movable flexible sheet-like members of a material having thermal insulation and heat resistance, said sheet-like members being adapted to cover the corresponding transverse rows of device receiving recesses formed in said planar heater plate, at least one window being formed through each of said sheet-like members, and said drive source comprising a drive source for driving said plurality of sheet-like members independently of each other in a winding-up manner at their opposite ends.

* * * * *